United States Patent
Liu et al.

(10) Patent No.: US 6,602,642 B2
(45) Date of Patent: Aug. 5, 2003

(54) OPTICAL PROXIMITY CORRECTION VERIFICATION MASK

(75) Inventors: Kun-Yi Liu, Tainan Shien (TW); Chin-Chuan Hsieh, Hsin-Chu (TW); Ching-Ming Chen, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/941,538

(22) Filed: Aug. 29, 2001

(65) Prior Publication Data

US 2003/0044692 A1 Mar. 6, 2003

(51) Int. Cl.⁷ .................................................. G03F 9/00
(52) U.S. Cl. .............................................. 430/5; 430/22
(58) Field of Search ............................... 430/5, 22, 394, 430/311, 312, 313; 356/399, 401

(56) References Cited

U.S. PATENT DOCUMENTS 5,962,173 A * 10/1999 Leroux et al. ................. 430/5

* cited by examiner

Primary Examiner—S. Rosasco
(74) Attorney, Agent, or Firm—Tung & Associates

(57) ABSTRACT

An optical proximity correction (OPC) verification mask is disclosed. The mask includes device areas that are separated by scribe lines. One or more OPC test patterns are integrated into the scribe lines for verification purposes. These patterns can include: line-end shortening (LES) patterns, such as serifs and hammerheads added to the ends of lines; corner rounding patterns, such as positive and negative serifs; and, scattering bars (SB's) and anti-scattering bars (ASB's) to compensate for isolated-dense proximity effects and isolated-feature depth of focus reduction. Other OPC patterns may also be included. A method for making the mask, and a semiconductor device created at least in part by a method including use of the mask, are also disclosed.

9 Claims, 6 Drawing Sheets

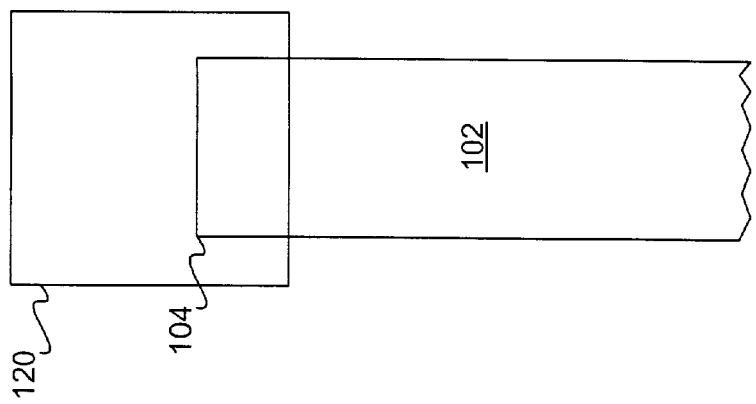
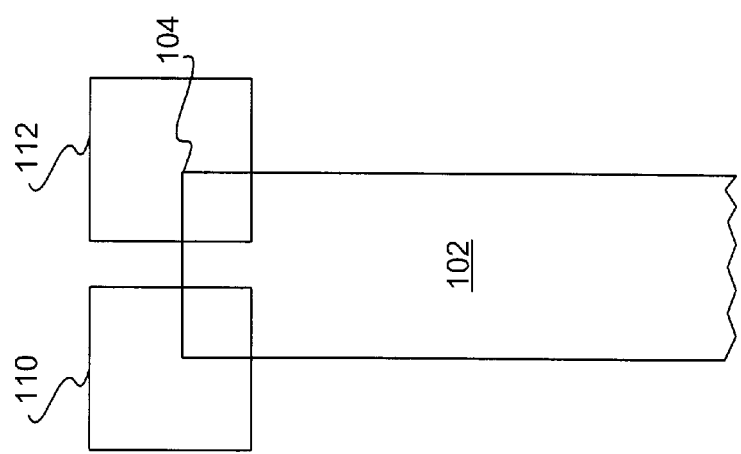
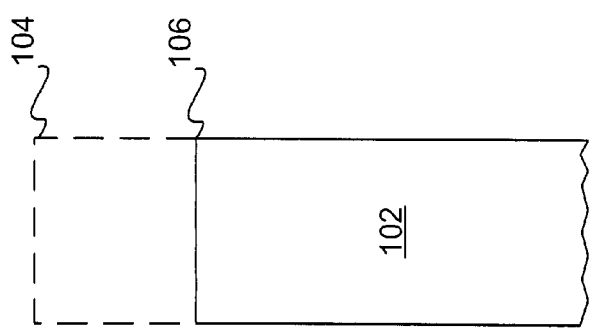

OPTICAL PROXIMITY CORRECTION VERIFICATION MASK

FIELD OF THE INVENTION

This invention relates generally to semiconductor device fabrication, and more particularly to the use of optical proximity correction (OPC) masks in such fabrication.

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, and less are becoming routine. Improvement in overlay tolerances in photolithography, and the introduction of new light sources with progressively shorter wavelengths, have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength.

Sub-wavelength lithography, however, places large burdens on lithographic processes. Resolution of anything smaller than a wavelength is generally quite difficult. Pattern fidelity can deteriorate dramatically in sub-wavelength lithography. The resulting semiconductor features may deviate significantly in size and shape from the ideal pattern drawn by the circuit designer. These distortions include line-width variations dependent on pattern density, which affect a device's speed of operation, and line-end shortening, which can break connections to contacts. To avoid these and other optical proximity effects, the semiconductor industry has attempted to compensate for them in the photomasks themselves.

This compensation is generally referred to as optical proximity correction (OPC). The goal of OPC is to produce smaller features in an IC using a given equipment set by enhancing the printability of a wafer pattern. OPC applies systematic changes to mask geometries to compensate for the nonlinear distortions caused by optical diffraction and resist process effects. A mask incorporating OPC is thus a system that negates undesirable distortion effects during pattern transfer. OPC works by making small changes to the IC layout that anticipate the distortions. OPC offers basic corrections and a useful amount of device yield improvement, and enables significant savings by extending the lifetime of existing lithography equipment. Distortions that can be corrected by OPC include line-end shortening, corner rounding, isolated-dense proximity effect, and isolated-line depth of focus reduction.

Line-end shortening (LES) is the shortening of the end of a metal line end in the actual fabricated semiconductor device as compared to the circuit designer's originally contemplated ideal device. An example of LES is shown in FIG. 1A. The line 102 should extend to the originally designed end 104. However, in actuality, the line 102 may only extend to the actually fabricated end 106. OPC can be used to correct LES by adding serifs or hammerheads to the originally designed end in the photomask, such that during photolithography, the actually fabricated end more closely approximates the location of the originally designed end. The addition of serifs is shown in FIG. 1B, in which the serifs 110 and 112 have been added to the line 102 at its end 104. The addition of a hammerhead is shown in FIG. 1C, in which the hammerhead 120 has been added to the line 102 at its end 104.

Corner rounding is the degree to which feature corners that should be at sharp angles are instead rounded by the lithography process. An example of corner rounding is shown in FIG. 2A. The feature 202 should include the outside sharp corner 204 and the inside sharp corner 206. However, in actuality, the feature 202 may only include the outside rounded corner 208 and the inside rounded corner 210. OPC can be used to correct corner rounding by adding serifs to outside corners, which are called positive serifs, and subtracting serifs from the inside corners, which are called negative serifs, to the feature in the photomask. This is shown in FIG. 2B, in which the positive serif 220 has been added to the outside corner 204 of the feature 202, and the negative serif 222 has been removed from the inside corner 210 of the feature 202.

Isolated-dense proximity effect, or bias, refers to the degree to which the mean of measured dense features differs from the mean of like-sized measured isolated features. Isolated-dense bias is especially important in the context of critical dimensions (CD's), which are the geometries and spacings used to monitor the pattern size and ensure that it is within the customer's specification. CD bias, therefore, refers to when the designed and actual values do not match. Ideally, bias approaches zero, but in actuality can measurably affect the resulting semiconductor device's performance and operation. Isolated features, such as lines, can also negatively affect depth of focus, such that they cannot be focused as well with the lithography equipment as can dense features.

OPC can be used to correct the isolated-dense proximity effect and the isolated-feature depth of focus reduction by adding scattering bars (SB's) and anti-scattering bars (ASB's) near the edges of opaque and clear features, respectively, on a photomask. SB's are sub-resolution opaque-like features, whereas ASB's are sub-resolution clear-like features. Both serve to alter the images of isolated and semi-isolated lines to match those of densely nested lines, and improve depth of focus so that isolated lines can be focused as well as dense lines can with the lithography equipment. For example, FIG. 3A shows a set of SB's 300, whereas FIG. 3b shows the placement of such sets of SB's 300 near an isolated line 302, in contradistinction to the dense sets of lines 304 and 306.

Unfortunately, OPC is a difficult process, because determining the optimal type, size, and symmetry of the compensations to be made on the mask can be very complex, and depends on neighboring geometries and process parameters. Usually, a sophisticated computer program is used to properly implement OPC. Using empirical data, OPC software creates a mathematical description of the process distortions, which can be in the form of simple shape manipulation rules, or a more detailed and intricate process model. Once this description is generated, automated software changes the shapes of the polygons in the pattern layout files, moving segments of line edges and adding features that compensate the layout for the distortions that will result. The critical levels of the photomask set can then be made using these modified, predistorted layout designs.

Like other semiconductor processes, OPC is desirably continually monitored and verified to ensure mask quality. Usually, OPC is inserted as part of a verification/tape-out activity. While OPC can more efficiently be included as part of mask data preparation, enough errors have been detected on wafers processed in this manner that many users are hesitant to make such significant changes to their pattern date without the insurance providing by repeating other verification steps after OPC has been applied. Mask inspection is also negatively impacted by OPC, since the addition of the small geometries may appear identical to features that mask inspection machines have been trained to recognize as defects. Masks and reticles with these features will appear to contain thousands of such defects, and be rejected. Manual inspection is also slow, because the technician must examine many different parts of each mask to ensure that the mask has been produced correctly. Since masks inherently differ based on the semiconductor device being fabricated, manual inspection can become a very laborious and non-standardized process. Production yield of new semiconductor devices as a result is usually reduced when using OPC.

Therefore, there is a need for an improved OPC mask verification process that alleviates these shortcomings. In particular, there is a need for such a verification process that can be accomplished relatively quickly and without incurring additional cost. There is a need to easily verify mask quality for each critical pattern, and for manual inspection to be as standardized as possible. For these and other reasons, there is a need for the present invention.

SUMMARY OF THE INVENTION

The invention relates to an optical proximity correction (OPC) verification mask. The mask includes device areas that are separated by scribe lines. One or more OPC test patterns are integrated into the scribe lines for verification purposes. These patterns can include: line-end shortening (LES) patterns, such as serifs and hammerheads added to the ends of lines; corner rounding patterns, such as positive and negative serifs; and, scattering bars (SB's) and anti-scattering bars (ASB's) to compensate for isolated-dense proximity effects and isolated-feature depth of focus reduction. Other OPC patterns may also be included.

The invention provides for advantages not found within the prior art. The integration of OPC patterns into the scribe lines of a photomask allows for easy and standardized monitoring and verification of mask quality. The technician, for instance, does not have to examine the entire mask, but rather only has to examine the standard OPC patterns integrated into the scribe lines of the mask. The OPC patterns are desirably standardized as integrated into the scribe lines of photomasks, regardless of the types of semiconductor devices for which the masks are intended. This standardized approach to mask verification allows for faster checking of the masks insofar as OPC is concerned.

Other advantages, embodiments, and aspects of the invention will become apparent by reading the detailed description that follows, and by referencing the attached drawings.

BRIEF DESCRIPTION OF THE DRAWINGS

FIGS. 1A, 1B, and 1C are diagrams showing the line-end shortening (LES) distortion, and how optical proximity correction (OPC) can be used to compensate for LES.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 4:
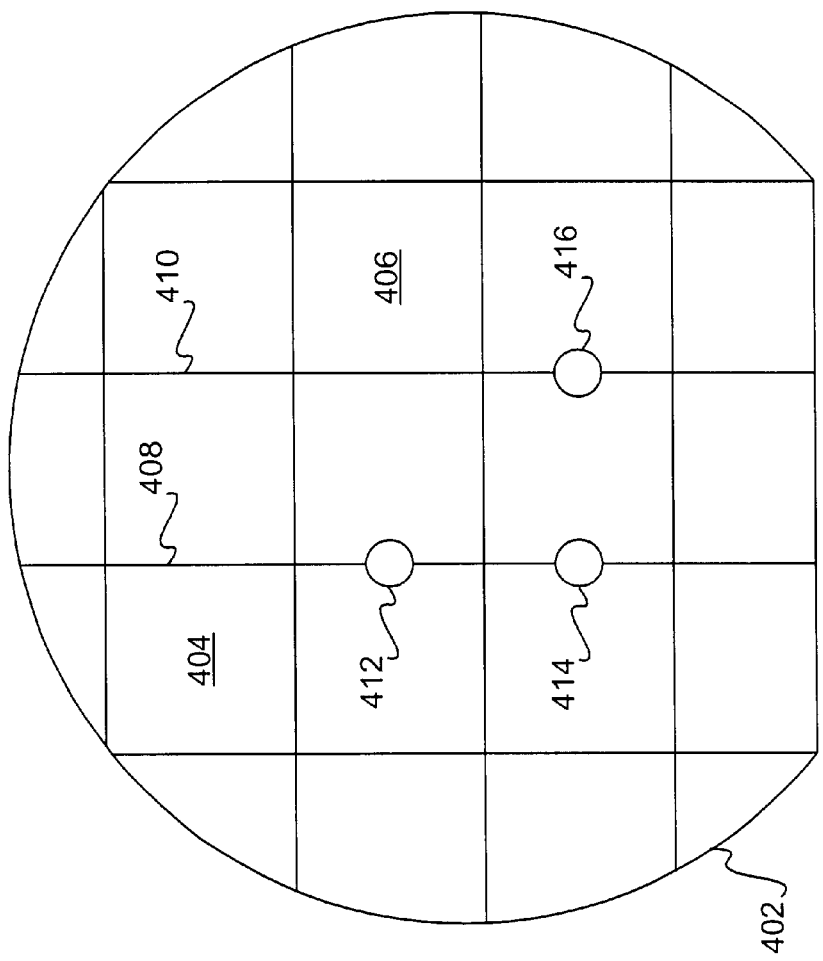
FIG. 4 is a diagram showing where OPC test patterns according to embodiments of the invention can be placed on a wafer, specifically on the scribe lines separating the dies of the wafer. The OPC test patterns themselves are imprinted on the wafer via lithography, using a photomask according to an embodiment of the invention.

FIG. 4 shows a semiconductor wafer 402 on which an OPC test pattern can be created, according to an embodiment of the invention. The wafer 402 has a number of semiconductor device areas, such as the areas 404 and 406. Each device area of the wafer 402 is for a separate semiconductor device to be fabricated. The device areas themselves may also be referred to as chips, dies, devices, circuits, microchips, and bars. They are used to identify the microchip patterns covering the majority of the surface of the wafer 402. The device areas are separated by scribe lines, such as the scribe lines 408 and 408. The scribe lines are also referred to as saw lines, streets, and avenues, and are the spaces between the chips that allow separation of the chip from the wafer.

Figure 5:
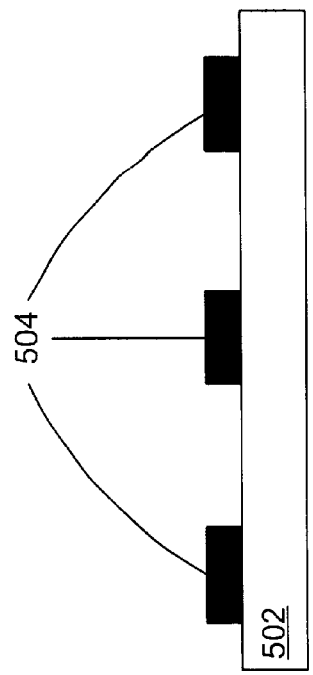
FIG. 5 is a diagram showing the side profile of an example photomask, such as that which can include OPC test patterns according to an embodiment of the invention.

The OPC test patterns are created on one or more of the scribe lines. For example, as shown in FIG. 4, the OPC patterns can be created in the areas on the scribe lines identified by the circles 412, 414, and 416. The OPC test patterns are created on the scribe lines by using a corresponding photomask, or mask or reticle, in conjunction with a photolithographic process. A side profile of an example mask is shown in FIG. 5, and includes a glass surface 502 on which chrome 504 is added. The chrome 504 corresponds to the pattern, such as the OPC pattern, to be imprinted on the semiconductor wafer. Areas of the mask that do not have chrome added to the glass surface are referred to as clear regions, whereas areas that do have chrome added to the glass surface are referred to as opaque regions.

Figure 2B:
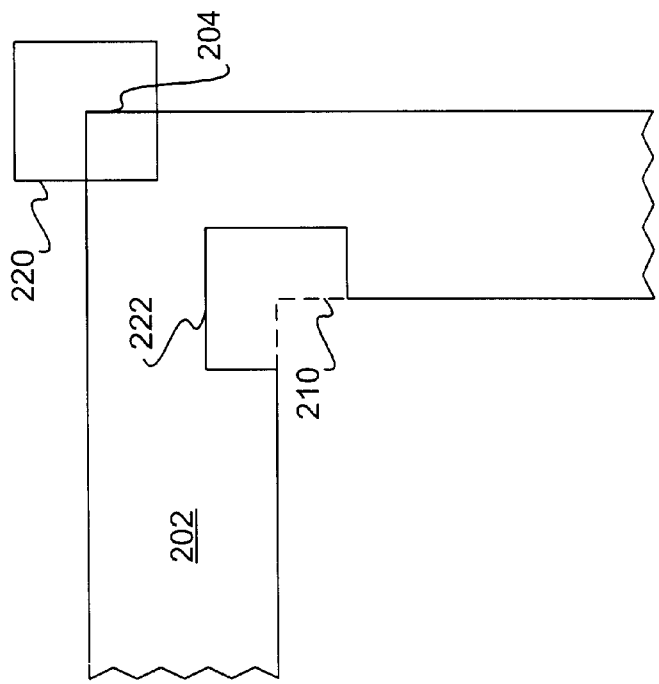
FIGS. 2A and 2B are diagrams showing the corner rounding distortion, and how OPC can be used to compensate for corner rounding.
Figure 2A:
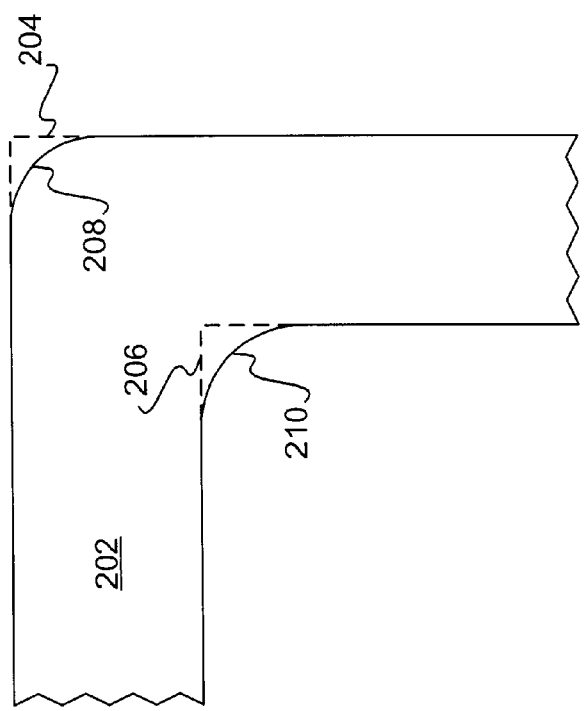
Figure 3B:
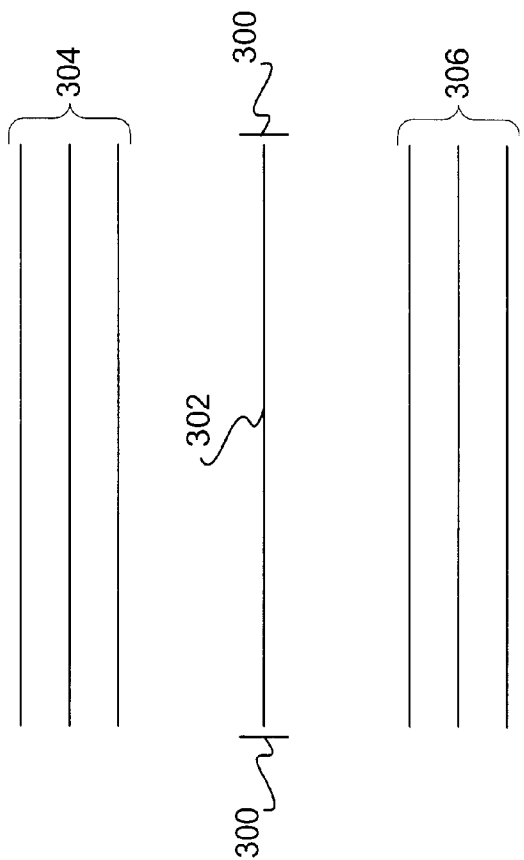
FIGS. 3A and 3B are diagrams showing a scattering bar (SB) and its placement near an isolated line, to compensate for isolated-dense proximity effect.
Figure 3A:
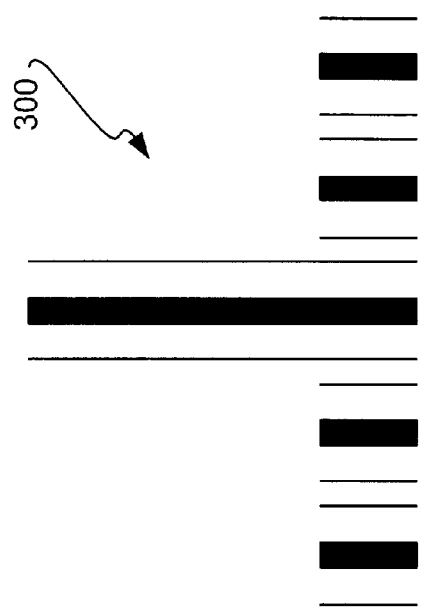

The types of OPC test patterns that can be included on the scribe lines of a photomask for transfer to a semiconductor wafer during semiconductor photolithography processing is not limited by the invention. As examples, the line-end shortening (LES) OPC patterns of FIGS. 1B and 1C may be included, specifically the serifs of FIG. 1B and the hammerhead of FIG. 1C. Furthermore, the corner rounding OPC pattern of FIG. 2B may be included, specifically the positive and negative serifs of FIG. 2B. As another example, scattering bars (SB's), such as those shown in FIG. 3B, and anti-scattering bars (ASB's) may be included. The OPC patterns included on the scribe lines of the photomask and the resulting processed semiconductor wafer in conjunction with the invention are preferably standardized, both in terms of pattern and location. This enables the technician to more easily monitor and verify the mask and the patterned wafers, as compared to the prior art.

Figure 6:
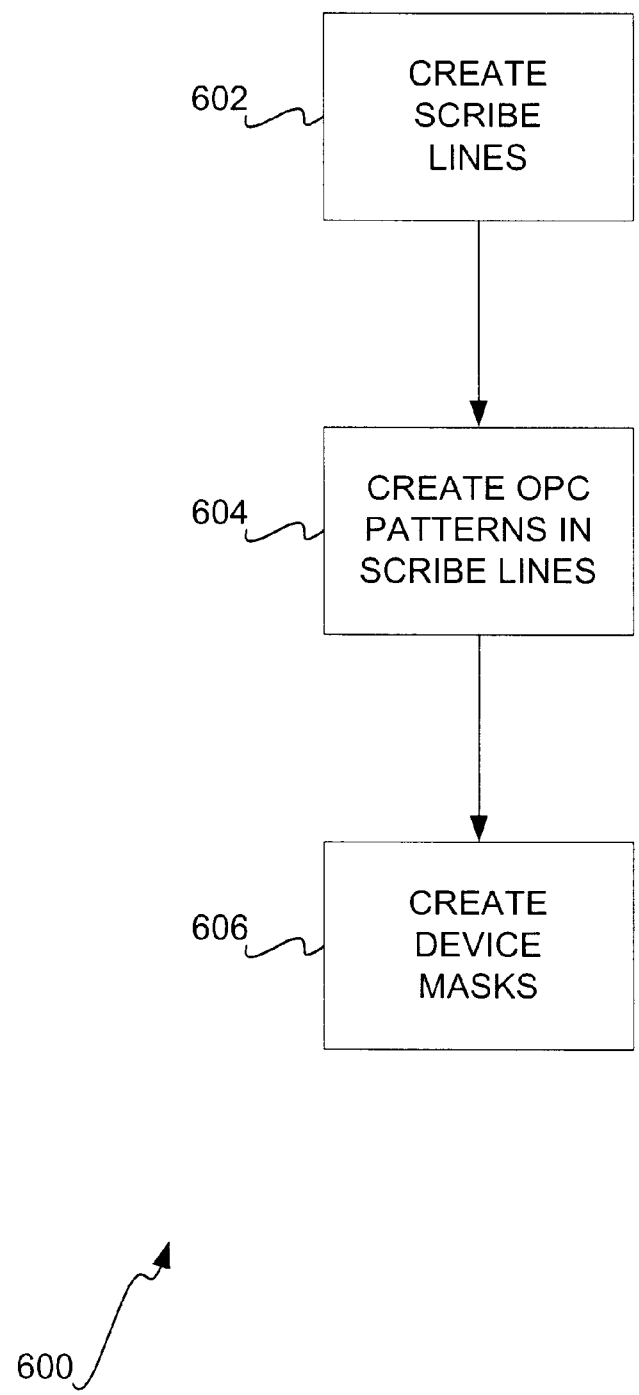
FIG. 6 is a flowchart of a method to create a photomask having OPC test patterns, according to an embodiment of the invention.

FIG. 6 shows a method 600 for producing a photomask including OPC patterns in accordance with the invention. First, the scribe lines are created on the mask (602), to define device areas on the mask. Next, OPC patterns are created on the mask in various locations in the scribe lines (604). The actual device masks on the device areas may then be created on the mask (606), where the device masks correspond to the dies on the semiconductor wafer that will be patterned using the mask created according to the method 600. The mask surface is typically borosilicate glass or quartz, and the patterns on the mask added in 602, 604, and/or 606 are typically added by sputtering and then patterning layers of chrome, chromium, chromium oxide, and/or chromium nitride.

Figure 7:
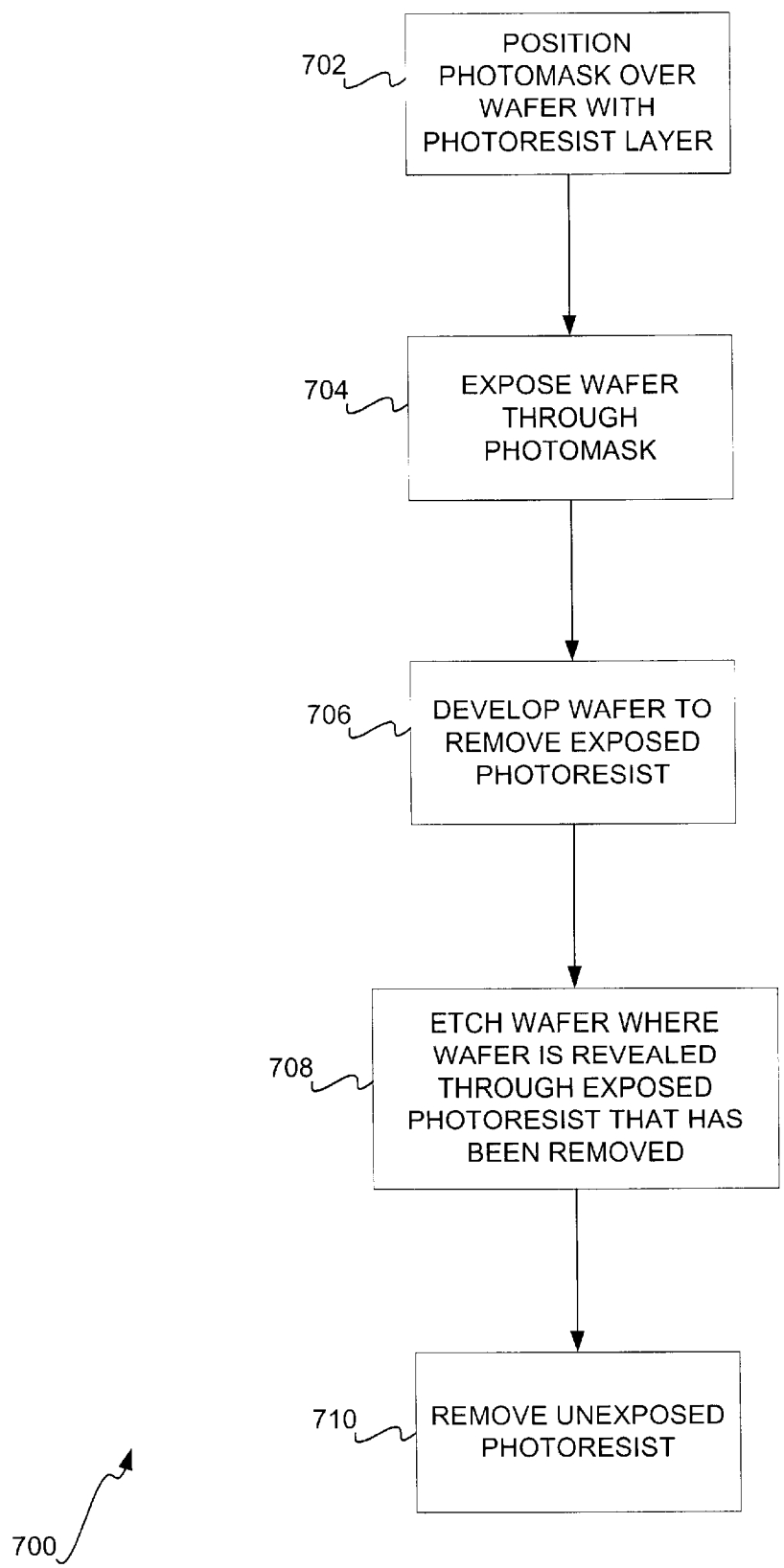
FIG. 7 is a flowchart of a typical method to create one or more semiconductor devices on a wafer using a photolithographic process, and preferably employing a photomask including OPC test patterns according to an embodiment of the invention.

FIG. 7 outlines a typical method 700 for fabricating semiconductor devices on a semiconductor wafer, and in conjunction with which a photomask having an OCR test pattern according to the invention may be utilized. Other steps and acts may be performed in addition to or in lieu of those shown in FIG. 7, as can be appreciated by those of ordinary skill within the art. The mask is first positioned over the wafer, where the wafer has a top layer of photoresist (702). The wafer is exposed through the mask (704), such that the photoresist has unexposed and exposed regions. The exposed regions correspond to the photoresist that is beneath clear regions of the mask, and the unexposed regions correspond to the photoresist that is beneath opaque regions. The wafer is developed to remove the exposed photoresist (706), and then etched where the wafer has been revealed through the exposed photoresist that has been removed (708). The unexposed photoresist is then also removed (710).

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method for verifying photomask quality comprising:
   for each of a plurality of photomasks, integrating one or more standard optical proximity correction (OPC) patterns into scribe lines of the mask; and,
   for each of the plurality of photomasks, inspecting by a technician only the OPC patterns integrated into the scribe lines of the mask to assess quality of the mask without having to examine other parts of the mask and regardless of a semiconductor type for which the mask is intended.

2. The method of claim 1, wherein the one or more OPC patterns comprises a line-end shortening (LES) OPC pattern.

3. The method of claim 2, wherein the LES OPC pattern comprises one or more serifs.

4. The method of claim 2, wherein the LES OPC pattern comprises one or more hammerheads.

5. The method of claim 2, wherein the one or more OPC patterns comprises a corner rounding OPC pattern.

6. The method of claim 5, wherein the corner rounding OPC pattern comprises one or more positive serifs.

7. The method of claim 5, wherein the corner rounding OPC pattern comprises one or more negative serifs.

8. The method of claim 1, wherein the one or more OPC patterns comprises one or more scattering bars (SB's) to compensate for at least one of isolated-dense proximity effect and isolated-feature depth of focus reduction.

9. The method of claim 1, wherein the one or more OPC patterns comprises one or more anti-scattering bars (ASB's) to compensate for at least one of isolated-dense proximity effect and isolated-feature depth of focus reduction.

* * * * *